United States Patent [19]
Lo et al.

[11] Patent Number: 5,920,073
[45] Date of Patent: Jul. 6, 1999

[54] OPTICAL SYSTEM

[75] Inventors: Chiwoei Wayne Lo, Campbell; William K. Lo, San Jose, both of Calif.

[73] Assignee: Schlumberger Technologies, Inc., San Jose, Calif.

[21] Appl. No.: 08/841,413

[22] Filed: Apr. 22, 1997

[51] Int. Cl.⁶ .................................................. H01J 37/09
[52] U.S. Cl. .................................... 250/396 R; 250/505.1
[58] Field of Search .............................. 250/396 R, 398, 250/503.1, 505.1

[56] References Cited

U.S. PATENT DOCUMENTS

| | | | |
|---|---|---|---|
| 2,356,535 | 8/1944 | Ruska | 250/505.1 |
| 3,291,959 | 12/1966 | Schleich et al. | 250/396 R |
| 3,638,015 | 1/1972 | Browning et al. . | |
| 3,989,348 | 11/1976 | Hudson et al. . | |
| 4,160,905 | 7/1979 | Davey . | |
| 4,218,621 | 8/1980 | Nakasuji et al. . | |
| 4,314,158 | 2/1982 | Lucido | 250/505.1 |
| 4,349,242 | 9/1982 | Ogura . | |
| 4,531,057 | 7/1985 | Kobayashi . | |
| 4,543,512 | 9/1985 | Nakasuji et al. . | |
| 4,544,242 | 10/1985 | Schindl . | |
| 4,683,366 | 7/1987 | Harte et al. . | |
| 4,684,809 | 8/1987 | Nakasuji . | |
| 4,694,178 | 9/1987 | Harte . | |
| 4,723,845 | 2/1988 | Mizutani et al. . | |
| 4,801,183 | 1/1989 | Palmer . | |
| 4,929,839 | 5/1990 | Parker et al. . | |
| 5,105,089 | 4/1992 | Yamada . | |
| 5,117,117 | 5/1992 | Oae et al. . | |
| 5,142,148 | 8/1992 | Sato . | |
| 5,180,919 | 1/1993 | Oae et al. . | |
| 5,218,524 | 6/1993 | Kasahara et al. . | |
| 5,223,970 | 6/1993 | Oono et al. . | |
| 5,264,706 | 11/1993 | Oae et al. . | |
| 5,291,021 | 3/1994 | Tanaka et al. | 250/505.1 |
| 5,295,989 | 3/1994 | Nakamura . | |
| 5,449,915 | 9/1995 | Yamada et al. . | |
| 5,483,065 | 1/1996 | Sato et al. . | |
| 5,661,307 | 8/1997 | Tanaka et al. . | |

*Primary Examiner*—Bruce C. Anderson
*Attorney, Agent, or Firm*—Danita J.M. Maseles

[57] ABSTRACT

An optical system for a particle beam device such as an electron microscope, e-beam device or FIB device, including a particle beam column having an optical axis along which a beam of particles is projected and an apertured plate positioned in the column having an aperture which is coaxial with the optical axis, the plate being moveable in a direction which is parallel to the optical axis.

20 Claims, 3 Drawing Sheets

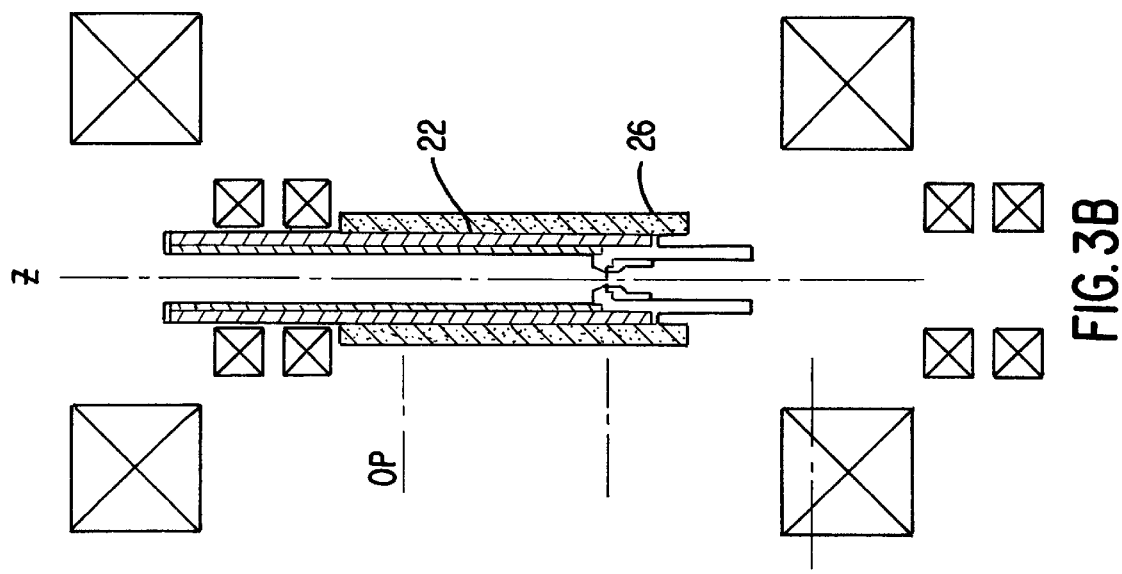
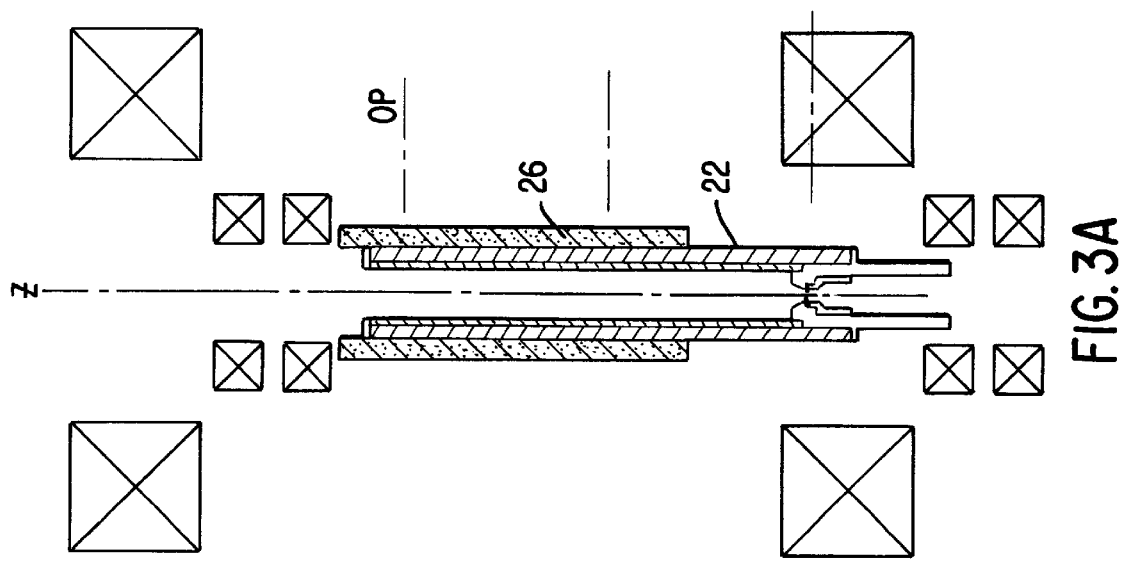

OPTICAL SYSTEM

FIELD OF THE INVENTION

The present invention relates to an optical system, and in particular to an optical system for use in charged particle beam systems such a electron beam (e-beam) or focused ion beam (FIB) systems. The invention provides an adjustable aperture for use in such systems.

BACKGROUND OF THE INVENTION

Aperture arrangements are used in light and charged particle optical systems to reduce beam divergence angles and beam intensity through the system. Apertures can also be used to intercept unused portions of the beam to prevent undesirable beam interactions with the optical system.

The ability to control beam divergence angle is important because it affects the magnitude of aberrations in the optical system. Such aberrations can cause an undesirable increase in beam spot size. The ability to change aperture size is also useful for controlling beam intensity. This may be required where a sample is sensitive to irradiation and reduced intensity is required. Alternatively, signal acquisition times may be critical in which case a higher intensity may be required. In a charged particle system, there is a trade-off between beam intensity and spot size, greater intensity necessarily resulting in a greater spot size for non-diffraction limited systems (i.e. most systems for e-beam testing and lithography). The ability to adjust the aperture is one method by which a user can tune the optical performance of a system (intensity vs. spot size) according to their particular requirements.

Two approaches have been previously proposed to allow variation of the aperture of a system, iris diaphragms and multiple fixed apertures of varying sizes.

Iris diaphragms have been used traditionally in light systems and include a single aperture with an iris mechanism which can be used to reduce the opening of the aperture. Iris diaphragms are usually limited to minimum aperture sizes of about 500 µm diameter and aperture member thickness of about 100 µm. For charged particle systems, apertures as small as 10 µm diameter and 1 µm thickness may be required to restrict the acceptance angle sufficiently. This effectively rules out the ability to use iris diaphragms.

An alternative mechanism used in such circumstances comprises a strip with a discrete number of fixed size apertures which may be positioned in the beam. Because no moving parts are involved in the apertures themselves, small diameters and thicknesses are possible. To change apertures, two approaches are possible. Either the strip is translated across the beam until the desired aperture is aligned with the beam, or the beam itself is deflected so as to pass through the desired aperture.

With either mechanism only discrete changes in aperture sizes, and, hence acceptance angles, are possible unless they are used in combination with other changes to the charged particle (electron) optical system such as changing lens excitations. However, changing lens excitation (focal length) changes the magnification of that lens. This leads to unwanted coupling between changes in (effective) aperture size and changes in electron optics.

It is an object of the present invention to provide an optical system in which the aperture is continuously variable and which does not suffer from the problems associated with previous approaches.

SUMMARY OF THE INVENTION

In accordance with the present invention, there is provided an optical system for a particle beam device or a light optical device, comprising an optical column, such as a particle beam column, having an optical axis along which a beam is projected; and an apertured member positioned in the column having an aperture which is substantially coaxial with the optical axis, the member being moveable in a direction which is substantially parallel to the optical axis.

This invention is particularly applicable to charged particle systems such as e-beam and FIB systems which require that the optical system be located in a vacuum chamber. The provision of a single, fixed size aperture which is moved along the optical axis of the system allows continuous variability of the aperture. Varying the position of the aperture along the optical axis with respect to the object plane acts to vary the angle subtended by the aperture at the object plane. In many important applications this has the same effect as changing the aperture size while keeping the position fixed. The effective number of different aperture sizes is determined by the resolution of the actuator used to move the apertured member. The range of aperture sizes available is determined by the size of the aperture used and the distance between the object plane and the apertured member at its extreme positions.

Since it is possible to position the moveable aperture within the optical column, the overall size of the system does not need to be increased, especially in the directions perpendicular to the optical axis. It is preferable to place the aperture system between the condenser lens and objective lens of the optical system.

It is also desirable to align the aperture center with the optical axis to reduce aberrations. One way to achieve this is to provide for movement of the aperture in the direction perpendicular to this axis. This is preferably achieved using an actuator arrangement at one end of a housing carrying the aperture member.

BRIEF DESCRIPTION OF THE DRAWINGS

FIGS. 3a and 3b shows embodiment of FIG. 1 at extreme positions.

DESCRIPTION OF THE PREFERRED EMBODIMENT

Figure 1:
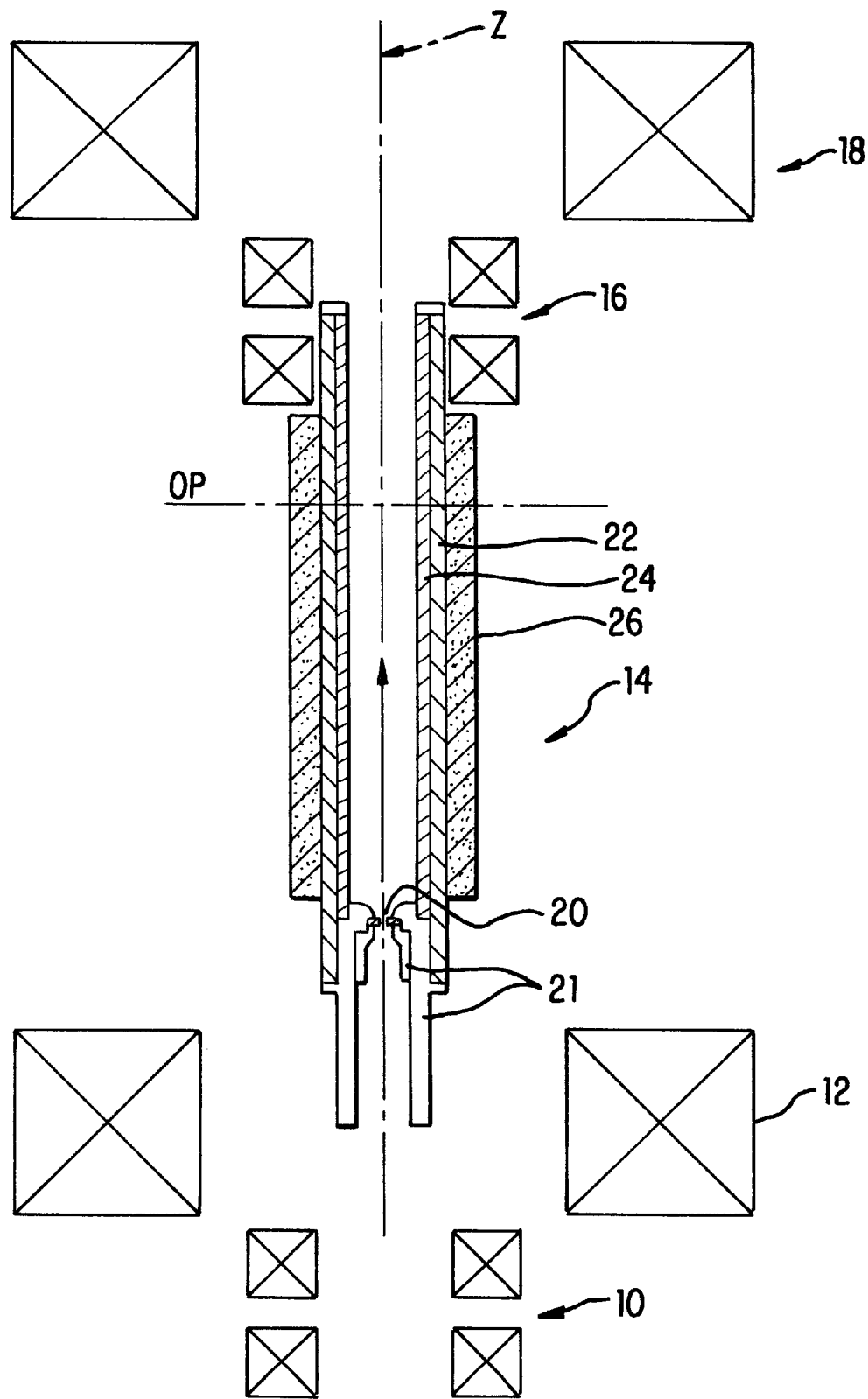
FIG. 1 shows a schematic view of an optical system according to one embodiment of the invention.

Referring now to FIG. 1, there is shown therein an optical column for an electron beam device (a Schlumberger IDS 10000 e-beam test system available from Schlumberger Technologies. Inc. of San Jose Calif.) according to one embodiment of the invention. Certain parts not essential to the understanding of the invention are omitted for clarity. A beam of electrons from a source (not shown) enters the column through a first set of beam deflectors 10 and pass through a condenser lens 12 into an aperture system indicated generally at 14. After passing through the aperture system 14, the beam exits the column via a second set of beam deflectors 16 and an objective lens 18 and is directed onto a sample (not shown).The aperture system 14 comprises a precision linear motor, such as a Burleigh "Haystack" Inchworm actuator, is positioned along the optical axis Z of the e-beam column in the vicinity of a beam crossover, e.g. objective lens object plane/condenser lens image plane. The actuator is vacuum compatible and non-magnetic. An aperture plate 20 is mounted in an aperture holder 21 which is in turn fixed to the hollow inner drive shaft 22 of the actuator. The plate has an aperture of predetermined size which can be less than 500 µm and the plate itself can be less than 50 µm edge thickness The drive shaft 22 is made of alumina and is lined with a metal tube 24 to prevent charging of its insulating surface. The motor housing 26 of the actuator is fixed in the column and locates the shaft 22 and aperture plate 20 concentric to the optical axis Z as closely as possible (the shaft 22 is concentric with the housing 26 to a few microns and is therefore essentially concentric with the axis Z as well). Power and drive signals are provided to the actuator by four electric leads (not shown). As the actuator is made of non-magnetic materials, it is possible for it to move through the center of the electro-optic arrangement without affecting its behavior. This allows a greater range of travel than would be permissible with an arrangement made of magnetic materials.

Activation of the actuator causes the drive shaft 22 to travel along the optical axis Z, moving the aperture 20 relative to the beam crossover OP and resulting in an effective change in aperture size. Steps as small as 4 nm are possible with the actuator described above, providing essentially a continuous variation in aperture size between the two extremes. FIGS. 3a and 3b show drive shaft 22 in its two extreme positions relative to the crossover OP which can typically be a total travel of about 1 inch. By monitoring the beam current after the aperture, the need to know exact accuracy of positioning is avoided. Changes in the beam current provide an indication of changes in the effective aperture size.

Figure 2:
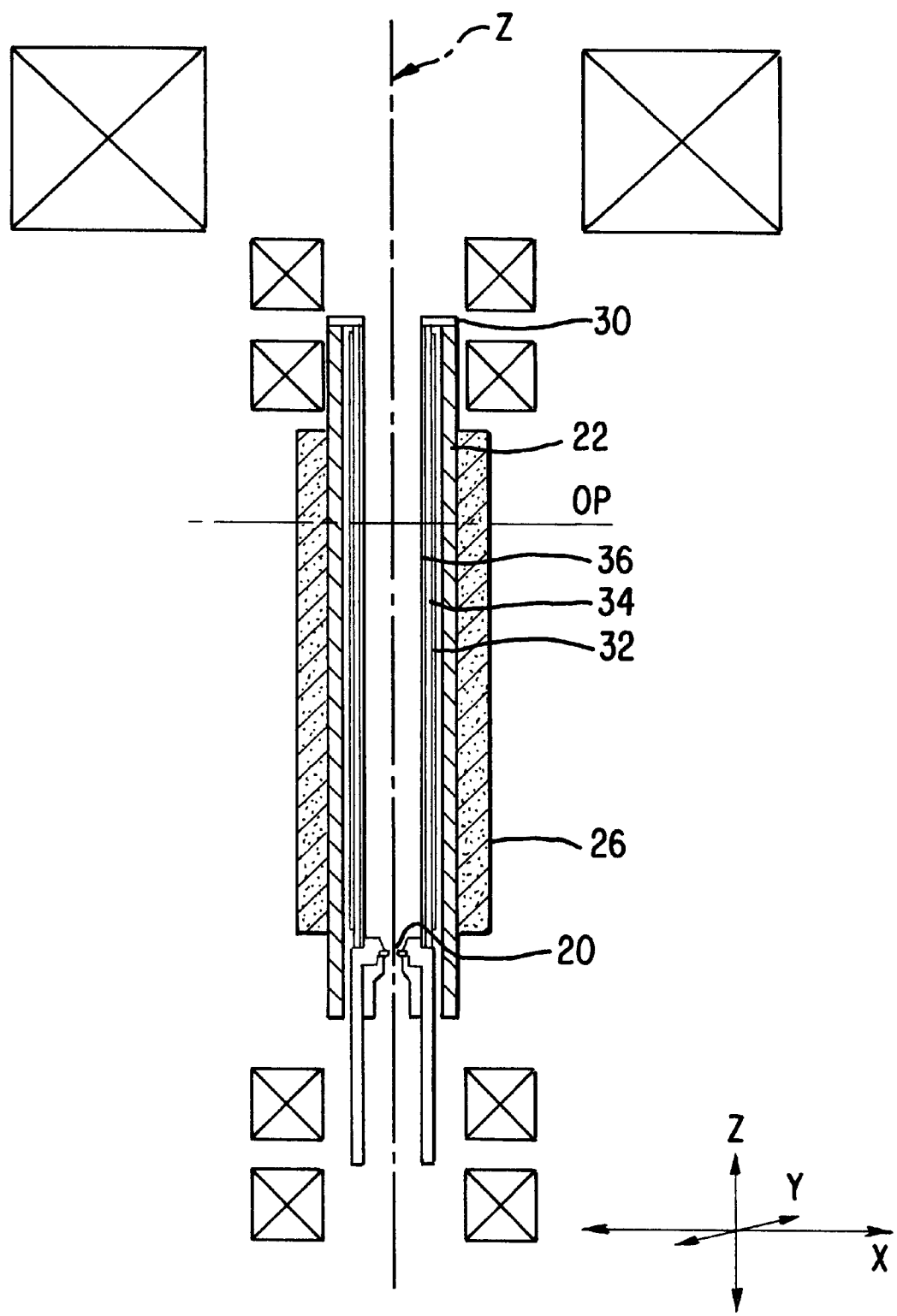
FIG. 2 shows a schematic view of an optical system according to a second embodiment of the invention.

In certain circumstances, it may be difficult to position the aperture on the optical axis to an accuracy greater than 1 mil, for example, due to machining errors. For small apertures where this error can be significant, the beam deflectors 10, 16 are used to obtain the proper beam/aperture alignment in the same manner as with a small, fixed position and size aperture which suffer from the same problem. An alternative approach is shown in FIG. 2. In this embodiment, the aperture plate 20 is mounted on a piezo-electric actuating device which is connected to the drive shaft 22 at its far end by means of a mount 30. The actuating device comprises a concentric arrangement of an outer, quadranted, high voltage x-y electrode 32, a piezo-electric actuator 34 and an inner, grounded x-y electrode 36. The aperture plate 20 is fixed to the piezo-electric actuator 34. With this arrangement, the metal liner tube 24 is not required as the inner electrode is grounded. The piezo-electric actuating device can provide a few mils of x-y (transverse to the optical axis Z) positioning, the actual amount depending upon the length of the actuator. For a 2 inch long actuator about 2 mils of positioning movement can be provided. Five additional electrical wires (not shown) are required to operate the piezoelectric actuating device. This arrangement is commonly used for scanned probe instruments. The quadranted outer electrode 32 is used in a conventional push-pull scheme to provide the appropriate level of positioning.

While the present invention has been described above in relation to an e-beam system, it will be appreciated that it is also applicable to other optical systems. In cases where these are not subject to magnetic influence, it is possible to use magnetic materials and magneto-restrictive actuators when appropriate.

We claim:

1. An optical system for a particle beam device, comprising:

a) a particle beam column having an optical axis along which a beam of particles is projected; and b) an apertured member positioned in the column having an aperture which is substantially coaxial with the optical axis, the member being moveable in a direction which is substantially parallel to the optical axis and wherein the apertured member is not located at a focal point.

2. An optical system as claimed in claim 1, wherein the column further comprises lenses and deflectors for focusing and deflecting the particle beam.

3. An optical system as claimed in claim 1, wherein the apertured member has a single aperture of fixed size defined therein.

4. An optical system as claimed in claim 1, wherein the apertured member is movably mounted in a substantially cylindrical housing mounted in the optical column around the optical axis.

5. An optical system as claimed in claim 4, further comprising an actuator arrangement positioned at one end of the housing for moving the apertured member in a plane perpendicular to the optical axis.

6. An optical system as claimed in claim 1, further comprising an actuator arrangement for moving the apertured member in a plane perpendicular to the optical axis.

7. An optical system as claimed in claim 1, further comprising a vacuum compatible, non-magnetic, linear actuator for moving the apertured member along the optical axis.

8. An optical system as claimed in claim 7, wherein the actuator comprises a piezoelectric element for causing movement of the member.

9. An optical system as claimed in claim 7, wherein the actuator comprises a magnetorestrictive element for causing movement of the member.

10. An optical system as claimed in claim 1, wherein the particle beam is a charged particle beam.

11. An optical system as claimed in claim 10, wherein the charged particle beam is an electron beam.

12. An optical system as claimed in claim 10, wherein the charged particle beam is a focused ion beam.

13. An optical system for a particle beam device, as claimed in claim 1, wherein the beam of particles has a current and further comprising a post-aperture beam current monitor.

14. An optical system for a particle beam device, comprising:

a) a particle beam column having an optical axis along which a beam of particles is projected; and b) an apertured member positioned in the column having an aperture which is substantially coaxial with the optical axis, the member being moveable in a direction which is substantially parallel to the optical axis; and wherein the column further comprises lenses and deflectors for focusing and deflecting the particle beam and the aperture member is positioned in the optical column between a condenser lens and objective lens.

15. An optical system as claimed in claim 14, an object plane being defined in the column and the apertured member subtending an angle at the object plane, the member being moved to vary the subtended angle.

16. An optical system, comprising:

a) an optical column having an optical axis along which an optical beam projects; and b) an apertured member positioned in the column having an aperture which is substantially coaxial with the optical axis, the member being moveable in a direction which is substantially parallel to the optical axis and wherein the apertured member is not located at a focal point.

17. An optical system as claimed in claim 16, wherein the optical beam comprises a beam selected from the group consisting of electron beams, ion beams and light beams.

18. An optical system for a particle beam device, comprising:
   a) a particle beam column having an optical axis along which a beam of particles is projected; and
   b) an apertured member positioned in the column having an aperture which is capable of limiting beam divergence angles and which is substantially coaxial with the optical axis, the member being moveable in a direction which is substantially parallel to the optical axis.

19. An optical system for a particle beam device, as claimed in claim 18, wherein the column further comprises lenses and deflectors for focusing and deflecting the particle beam.

20. An optical system for a particle beam device, as claimed in claim 18, wherein the aperture member is positioned in the optical column between a condenser lens and objective lens.

\* \* \* \* \*